United States Patent
Cheng et al.

(10) Patent No.: US 10,693,019 B2
(45) Date of Patent: Jun. 23, 2020

(54) FILM SCHEME FOR A HIGH DENSITY TRENCH CAPACITOR

(71) Applicant: Taiwan Semiconductor Manufacturing Co., Ltd., Hsin-Chu (TW)

(72) Inventors: Hsin-Li Cheng, Hsin Chu (TW); Jyun-Ying Lin, Wujie Township (TW); Jing-Hwang Yang, Zhubei (TW); Ting-Chen Hsu, Taichung (TW); Felix Ying-Kit Tsui, Cupertino, CA (US); Yen-Wen Chen, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/113,028

(22) Filed: Aug. 27, 2018

(65) Prior Publication Data

US 2020/0066922 A1    Feb. 27, 2020

(51) Int. Cl.
*H01L 49/02* (2006.01)
*H01L 27/06* (2006.01)
*H01L 29/94* (2006.01)
*H01L 29/66* (2006.01)

(52) U.S. Cl.
CPC ............ *H01L 29/945* (2013.01); *H01L 28/87* (2013.01); *H01L 28/91* (2013.01); *H01L 29/66181* (2013.01)

(58) Field of Classification Search
CPC ............... H01L 27/0805; H01L 27/101; H01L 27/10829; H01L 29/66181; H01L 29/945
See application file for complete search history.

(56) References Cited

U.S. PATENT DOCUMENTS

| | | | | |
|---|---|---|---|---|
| 2006/0275981 A1* | 12/2006 | Avellan | ............. | H01L 27/10829 438/253 |
| 2008/0291601 A1* | 11/2008 | Roozeboom | ........ | H01L 27/0805 361/306.2 |
| 2011/0201161 A1* | 8/2011 | Ervin | .................. | H01L 21/2652 438/155 |

(Continued)

OTHER PUBLICATIONS

Roozeboom et al. "Ultrahigh-Density (> 0.4 μF/mm2) Trench Capacitors in Silicon." First Int. Workshop on Power Supply on Chip (PowerSoC08), Sep. 22-24, 2008, Cork, Ireland.

*Primary Examiner* — David C Spalla
(74) *Attorney, Agent, or Firm* — Eschweiler & Potashnik, LLC

(57) ABSTRACT

Various embodiments of the present application are directed towards a trench capacitor with a high capacitance density. In some embodiments, the trench capacitor overlies the substrate and fills a trench defined by the substrate. The trench capacitor comprises a lower capacitor electrode, a capacitor dielectric layer, and an upper capacitor electrode. The capacitor dielectric layer overlies the lower capacitor electrode and lines the trench. The upper capacitor electrode overlies the capacitor dielectric layer and lines the trench over the capacitor dielectric layer. The capacitor dielectric layer comprises a high κ dielectric material. By using a high κ material for the dielectric layer, the trench capacitor may have a high capacitance density suitable for use with high performance mobile devices.

20 Claims, 11 Drawing Sheets

(56) References Cited

U.S. PATENT DOCUMENTS

2016/0020267 A1\* 1/2016 Lin .................. H01L 28/91
  257/532
2016/0190230 A1\* 6/2016 Krach ............... H01L 29/66181
  257/532

\* cited by examiner

FILM SCHEME FOR A HIGH DENSITY TRENCH CAPACITOR

BACKGROUND

Mobile phones and other mobile devices often rely upon ceramic capacitors and other passive devices discretely mounted to printed circuit boards (PCBs) of the mobile devices and electrically coupled to integrated circuits (ICs) of the mobile devices by the PCBs. However, this uses large amounts of surface area on the PCBs and hence limits mobile device size and/or mobile device functionality. Further, discretely mounting and electrically coupling the passive devices increases manufacturing costs. Accordingly, mobile devices are increasingly turning to integrated passive devices (IPDs) to reduce size, reduce cost, and increase functionality. An IPD is a collection of one or more passive devices embedded into a single monolithic device and packaged as an integrated circuit (IC).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
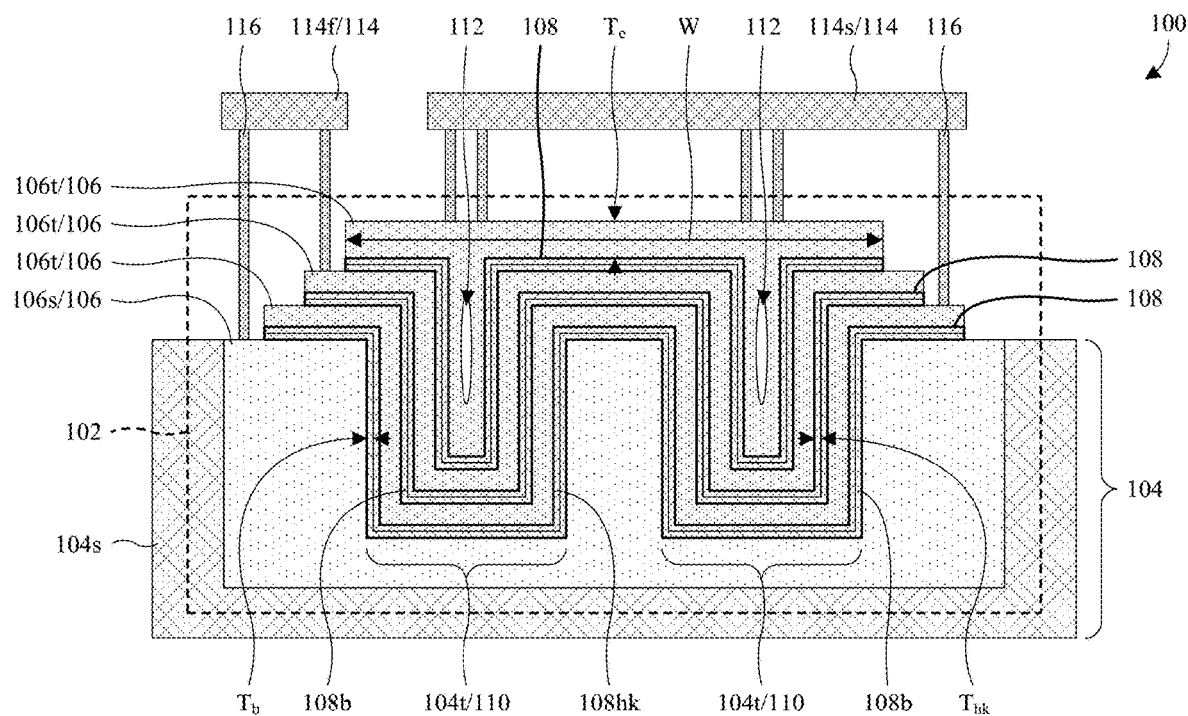
FIG. 1 illustrates a cross-sectional view of some embodiments of a semiconductor structure comprising a trench capacitor with a high capacitance density.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Trench capacitors are commonly embedded in integrated passive devices (IPDs) and used in place of ceramic capacitors to reduce the size of mobile devices, reduce the cost of mobile devices, increase the functionality of mobile devices, or any combination of the foregoing. In some instances, a trench capacitor overlies a semiconductor substrate and fills a trench defined by the semiconductor substrate. Further, the trench capacitor comprises multiple electrodes and one or more dielectric layers, where the multiple electrodes and the dielectric layer(s) are alternatingly stacked in the trench. The multiple electrodes comprise a substrate electrode and one or more polysilicon electrodes. The substrate electrode is defined by a doped region of the semiconductor substrate that lines sidewalls of the trench, and the polysilicon electrode(s) is/are stacked over the substrate electrode.

A challenge with the trench capacitor is that the dielectric layer(s) is/are silicon oxide and/or silicon nitride, which limits a capacitance density of the trench capacitor to no more than about 800 nanofarad per squared millimeter ($nF/mm^2$). Further, the limited capacitance density limits computing performance for the mobile devices.

Various embodiments of the present application are directed towards a trench capacitor with a high capacitance density. The high capacitance density may, for example, be a capacitance density greater than about 800, 900, or 1000 $nF/mm^2$. In some embodiments, the trench capacitor overlies the substrate and fills a trench defined by the substrate. The trench capacitor comprises a lower capacitor electrode, a capacitor dielectric layer, and an upper capacitor electrode. The lower capacitor electrode is defined by a doped region of the substrate into which the trench extends. The capacitor dielectric layer overlies the lower capacitor electrode and lines the trench. The upper capacitor electrode overlies the capacitor dielectric layer and lines the trench over the capacitor dielectric layer. The capacitor dielectric layer comprises a high κ dielectric material, such as, for example, hafnium oxide, zirconium oxide, or aluminum oxide. By using a high κ material for the dielectric layer, the trench capacitor may have a high capacitance density suitable for use with high performance mobile devices.

With reference to FIG. 1, a cross-sectional view 100 of some embodiments of a semiconductor structure comprising a trench capacitor 102 is provided. The semiconductor structure may be, or may be part of, an integrated circuit (IC), an IPD, or some other semiconductor structure. The trench capacitor 102 overlies a semiconductor substrate 104 and fills a plurality of trenches 104*t* defined by the semiconductor substrate 104. The semiconductor substrate 104 may be or comprise, for example, a bulk semiconductor substrate, a silicon-on-insulator (SOI) substrate, or some other semiconductor substrate. Further, the semiconductor substrate 104 may be or comprise, for example, monocrystalline silicon, some other silicon, or some other semiconductor material. The trench capacitor 102 comprises a plurality of capacitor electrodes 106 and a plurality of capacitor dielectric layers 108.

The capacitor electrodes 106 and the capacitor dielectric layers 108 are alternatingly stacked, such that each of the capacitor electrodes 106 is spaced from each neighboring one of the capacitor electrodes 106 by a corresponding one of the capacitor dielectric layers 108. Further, the capacitor electrodes 106 and the capacitor dielectric layers 108 decrease in width W from a bottom of the trench capacitor 102 to a top of the trench capacitor 102. In some embodiments, each of the capacitor electrodes 106 has the same width as an immediately underlying one of the capacitor dielectric layers 108, and/or each of the capacitor electrodes 106 completely overlies an immediately underlying one of the capacitor electrodes 106. In some embodiments, the trench capacitor 102 has a stepped profile on opposite sides of the trench capacitor 102. The capacitor electrodes 106 and the capacitor dielectric layers 108 define multiple trench segments 110, each filling a respective one of the trenches 104*t*.

The capacitor electrodes 106 comprise a substrate electrode 106*s* and a plurality of trench electrodes 106*t*. The substrate electrode 106*s* is a semiconductor region of the semiconductor substrate 104 that is doped so it is conductive. Further, the substrate electrode 106*s* has a different doping profile than a surrounding semiconductor region 104*s* of the semiconductor substrate 104. For example, the substrate electrode 106*s* may have the same doping type as, but a higher doping concentration than, the surrounding semiconductor region 104*s*. The trench electrodes 106*t* are stacked over the substrate electrode 106*s* and may be or comprise, for example, doped polysilicon, metal, some other conductive material, or any combination of the foregoing. Further, each of the trench electrodes 106*t* has a thickness $T_e$. For ease of illustration, the thickness $T_e$ is only labeled for one of the trench electrodes 106*t*. In some embodiments, the thickness $T_e$ is uniform or substantially uniform, and/or is between about 1500-4000 angstroms, about 1500-3250 angstroms, or about 3250-4000 angstroms. In some embodiments, the trench electrodes 106*t* are each conformal. In some embodiments, a topmost one of the trench electrodes 106*t* is thicker than a remainder of the trench electrodes 106*t*. In some embodiments, the topmost one of the trench electrodes 106*t* defines a closed gap 112 at each of the trench segments 110. The closed gap 112 may, for example, be hermetically sealed and/or may, for example, accommodate air and/or some other gas. The closed gap may, for example, form due to the trenches 104*t* having a high aspect ratio (i.e., a high ratio of height to width) during formation of the trench capacitor 102.

The capacitor dielectric layers 108 separate and electrically insulate the capacitor electrodes 106 from each other. Further, the capacitor dielectric layers 108 are or comprise a high κ dielectric material. The high κ dielectric material has a dielectric constant κ greater than that of silicon nitride and/or greater than about 10, 20, or 50. The high κ dielectric material may be or comprise, for example, hafnium oxide, zirconium oxide, aluminum oxide, some other high κ dielectric, or any combination of the foregoing. Because the capacitor dielectric layers 108 are or comprise the high κ dielectric material, the trench capacitor 102 may have a high capacitance density suitable for use with high performance mobile devices. The high capacitance density may, for example, be a capacitance density greater than about 800, 900, or 1000 nF/mm².

In some embodiments, the capacitor dielectric layers 108 each comprise a high κ capacitor dielectric layer 108*hk* and a base capacitor dielectric layer 108*b*. For ease of illustration, the high κ capacitor dielectric layer 108*hk* is only labeled for one of the capacitor dielectric layers 108, and the base capacitor dielectric layer 108*b* is only labeled for some of the capacitor dielectric layers 108. The high κ capacitor dielectric layer 108*hk* overlies the base capacitor dielectric layer 108*b* and is or comprises the high κ dielectric material (e.g., a material with a dielectric constant κ greater than about 10). Further, the high κ capacitor dielectric layer 108*hk* has a thickness $T_{hκ}$. For ease of illustration, the thickness $T_{hκ}$ is only labeled for the high κ capacitor dielectric layer 108*hk* of one of the capacitor dielectric layers 108. In some embodiments, the thickness $T_{hκ}$ is uniform or substantially uniform and/or is between about 25-50 angstroms, about 25-35 angstroms, or about 35-50 angstroms. Further, in some embodiments, the high κ capacitor dielectric layer 108*hk* is conformal.

The base capacitor dielectric layer 108*b* underlies the high κ capacitor dielectric layer 108*hk* and is or comprises a material with a dielectric constant κ less than or about 10, 6, or 3.9. For example, the base capacitor dielectric layer 108*b* may be or comprise silicon oxide, silicon nitride, some other dielectric, or any combination of the foregoing. Further, the base capacitor dielectric layer 108*b* has a dielectric constant κ less than that of the high κ capacitor dielectric layer 108*hk* and has a thickness $T_b$. For ease of illustration, the thickness $T_b$ is only labeled for the base capacitor dielectric layer 108*b* of one of the capacitor dielectric layers 108. In some embodiments, the thickness $T_b$ is uniform or substantially uniform and/or is between about 20-40 angstroms, about 20-30 angstroms, or about 30-40 angstroms. Further, in some embodiments, the base capacitor dielectric layer 108*b* is conformal. The base capacitor dielectric layer 108*b* provides enhanced electrical insulation between corresponding electrodes to reduce leakage current, thereby enhancing performance and power efficiency of the trench capacitor 102.

In some embodiments, a plurality of wires 114 and a plurality of vias 116 overlie the trench capacitor 102. For ease of illustration, only some of the vias 116 are labeled 116. The wires 114 comprise a first capacitor wire 114*f* and a second capacitor wire 114*s*. The first capacitor wire 114*f* is electrically coupled to every other electrode of the capacitor electrodes 106 by the vias 116, from a bottom of the trench capacitor 102 to a top of the capacitor. The second capacitor wire 114*s* is electrically coupled to a remainder of the capacitor electrodes 106 by the vias 116. The first capacitor wire 114*f* may, for example, define a cathode of the trench capacitor 102, whereas the second capacitor wire 114*s* may, for example, define an anode of the trench capacitor 102, or vice versa. The wires 114 and the vias 116 may be or comprise, for example, copper, aluminum copper, aluminum, tungsten, some other metal, some other conductive material, or any combination of the foregoing.

While the trench capacitor 102 is illustrated with two trench segments 110, more or less trench segments 110 are amenable in other embodiments. While the trench capacitor 102 is illustrated with three trench electrodes 106t, more or less trench electrodes 106t are amenable in other embodiments. In such embodiments, the number of capacitor dielectric layers 108 increases or decreases with the number of trench electrodes 106t. While the trench capacitor 102 is illustrated with the substrate electrode 106s, the substrate electrode 106s may be omitted in other embodiments. While the capacitor dielectric layers 108 are each illustrated with the base capacitor dielectric layer 108b and the high κ capacitor dielectric layer 108hk, the base capacitor dielectric layer 108b may be omitted in one, some, or all of the capacitor dielectric layers 108 in other embodiments. In some of such other embodiments, the one or more capacitor dielectric layers 108 without a base capacitor dielectric layer 108b is/are each defined wholly or substantially by the high κ capacitor dielectric layer 108hk.

Figure 2A:
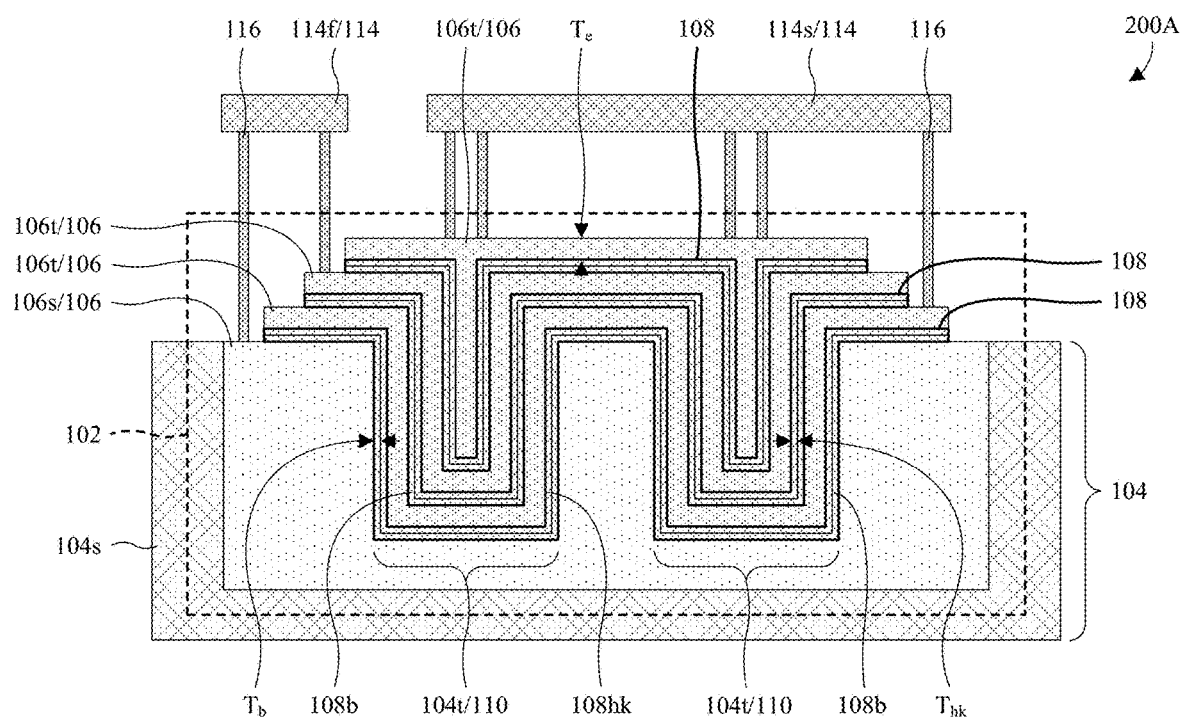
FIG. 2A illustrates a cross-sectional view of some alternative embodiments of the semiconductor structure of FIG. 1 in which closed gaps at trench segments are omitted.

With reference to FIG. 2A, a cross-sectional view 200A of some alternative embodiments of the semiconductor structure of FIG. 1 is provided in which the closed gaps 112 at the trench segments 110 are omitted. Further, in some embodiments, a topmost one of the trench electrodes 106t has the same or substantially the same thickness $T_e$ as a remainder of the trench electrodes 106t.

Figure 2B:
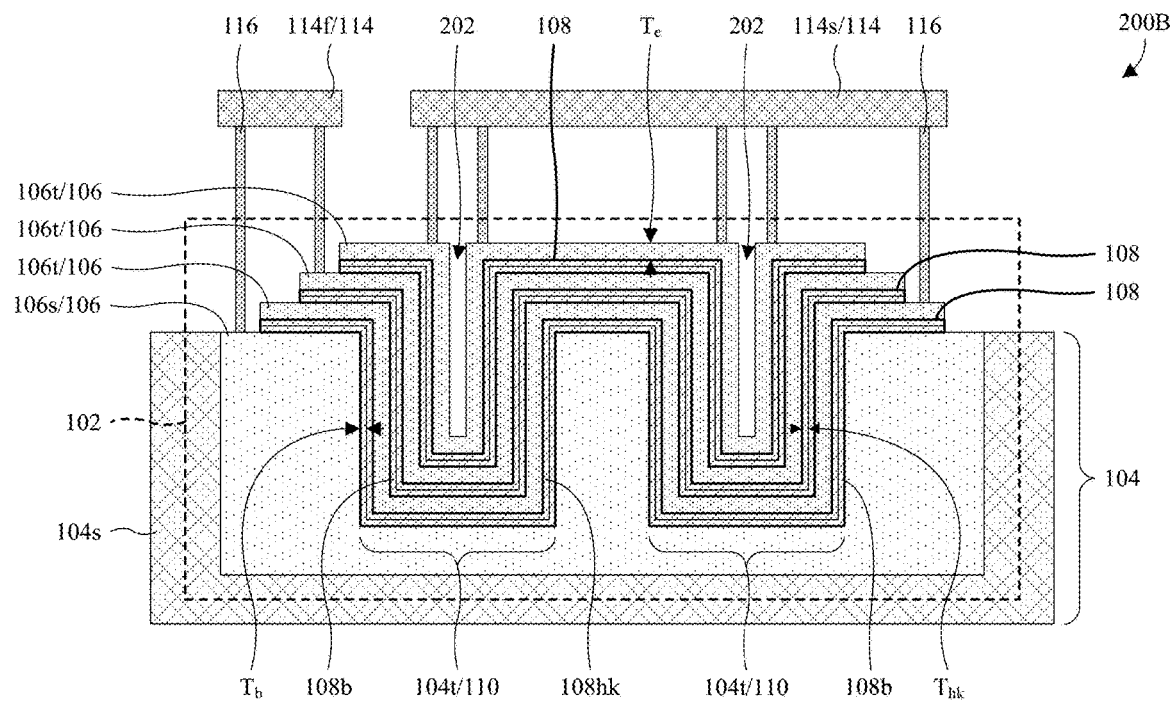
FIG. 2B illustrates a cross-sectional view of some alternative embodiments of the semiconductor structure of FIG. 1 in which closed gaps at trench segments are replaced with open gaps.

With reference to FIG. 2B, a cross-sectional view 200B of some alternative embodiments of the semiconductor structure of FIG. 1 is provided in which the closed gaps 112 at the trench segments 110 are replaced with open gaps 202. The open gaps 202 absorb stress induced on the semiconductor substrate 104 by the trench segments 110, which may reduce the likelihood of warping, breaking, or cracking of the semiconductor substrate 104. In some embodiments, a topmost one of the trench electrodes 106t also has the same or substantially the same thickness $T_e$ as a remainder of the trench electrodes 106t.

Figure 3:
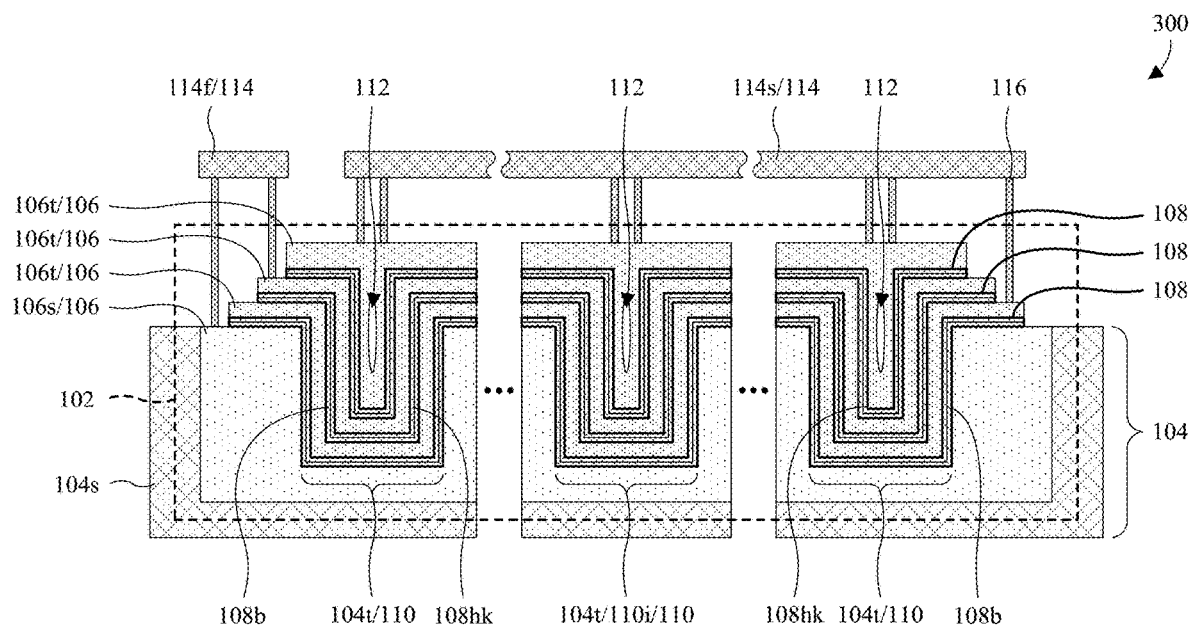
FIG. 3 illustrates a cross-sectional view of some alternative embodiments of the semiconductor structure of FIG. 1 in which the trench capacitor has three of more trench segments.

With reference to FIG. 3, a cross-sectional view 300 of some alternative embodiments of the semiconductor structure of FIG. 1 is provided in which the trench capacitor 102 has three of more trench segments 110. Three trench segments 110 of the trench capacitor 102 are illustrated, and zero or more additional trench segments of the trench capacitor 102 may be at each of the ellipses. The zero or more additional trench segments may, for example, each be as an intermediate trench segment 110i of the trench capacitor 102 is illustrated.

Figure 4:
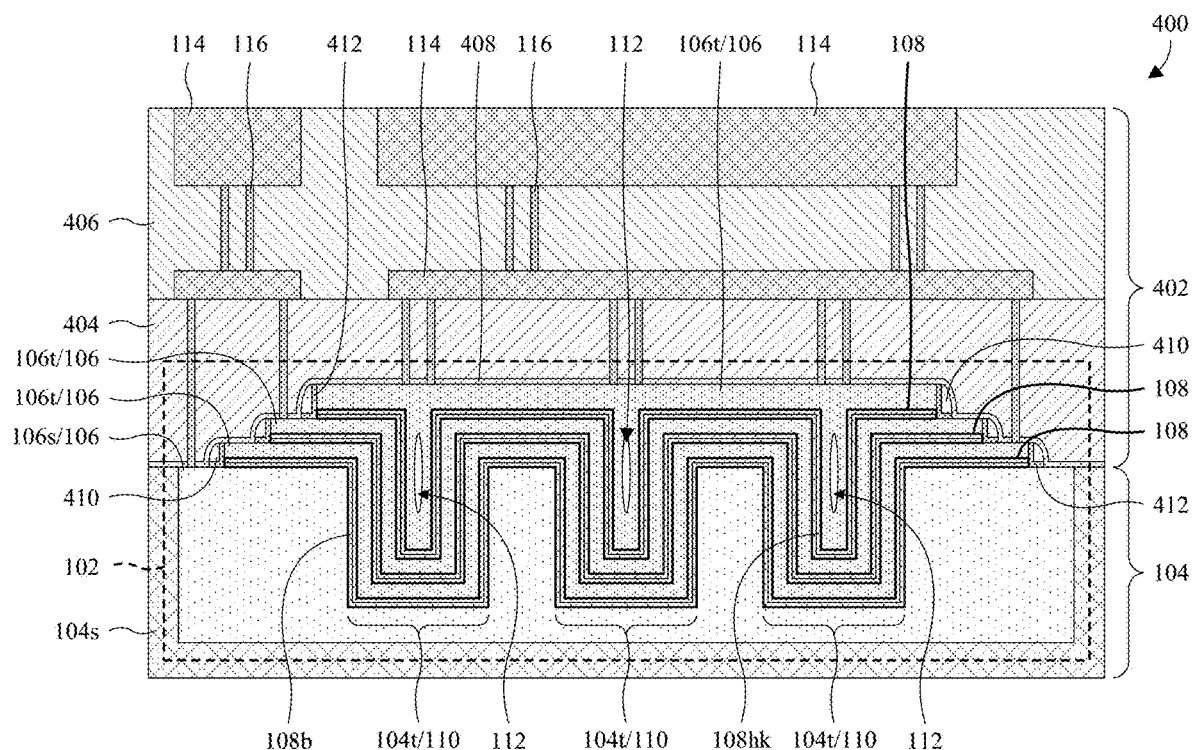
FIG. 4 illustrates a cross-sectional view of some more detailed embodiments of the semiconductor structure of FIG. 3 in which the trench capacitor has three trench segments and is covered by a back-end-of-line (BEOL) interconnect structure.

With reference to FIG. 4, a cross-sectional view 400 of some more detailed embodiments of the semiconductor structure of FIG. 3 is provided in which the trench capacitor 102 has three trench segments 110 and is covered by a back-end-of-line (BEOL) interconnect structure 402. The BEOL interconnect structure 402 comprises an interlayer dielectric (ILD) layer 404 and an inter metal dielectric (IMD) layer 406 overlying the ILD layer 404, and further comprises the plurality of wires 114 and the plurality of vias 116. For ease of illustration, only some of the wires 114 are labeled 114 and only some of the vias 116 are labeled 116.

The ILD layer 404 and the IMD layer 406 may be or comprise, for example, silicon dioxide, a low κ dielectric, silicon nitride, some other suitable dielectric(s), or any combination of the foregoing. As used herein, a low κ dielectric may be, for example, a dielectric with a dielectric constant κ less than about 3.9, 3, 2, or 1. The wires 114 and the vias 116 are alternatingly stacked in the ILD layer 404 and the IMD layer 406 and may be or comprise, for example, copper, aluminum copper, aluminum, tungsten, some other metal or conductive material, or any combination of the foregoing.

In some embodiments, an etch stop layer 408 overlies and conforms to the trench capacitor 102. The etch stop layer 408 may, for example, serve as an etch stop during formation of a bottommost layer of the vias 116. Further, the etch stop layer 408 may, for example, be or comprise silicon nitride, silicon oxynitride, silicon oxide, some other dielectric material, or any combination of the foregoing.

In some embodiments, spacers 410 line sidewalls of the trench electrodes 106t. Further, in some embodiments, the spacers 410 are separated from the sidewalls of the trench electrodes 106t by spacer liners 412. For ease of illustration, only some of the spacers 410 are labeled 410, and only some of the spacer liners 412 are labeled 412. The spacers 410 may be or comprise, for example, silicon nitride, silicon oxynitride, silicon oxide, some other dielectric material, or any combination of the foregoing. The spacer liners 412 are a different material than the spacers 410 and may be or comprise, for example, silicon oxide, some other dielectric material, or any combination of the foregoing.

Figure 5A:
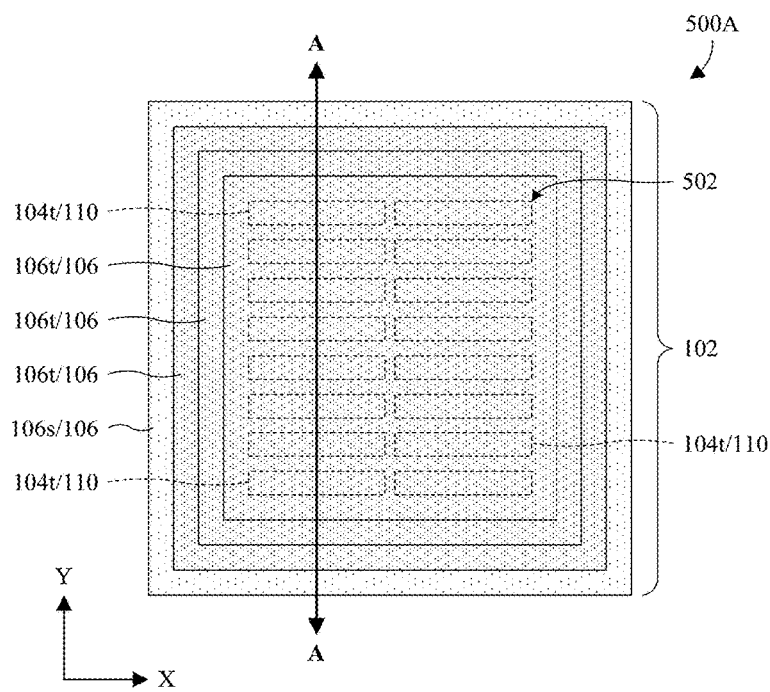
FIG. 5A illustrates a top view of some more detailed embodiments of the semiconductor structure of FIG. 3 in which trench segments are arranged in a two-dimensional (2D) trench array.

With reference to FIG. 5A, a top view 500A of some more detailed embodiments of the semiconductor structure of FIG. 3 is provided in which the trench segments 110 are arranged in a two-dimensional (2D) trench array 502. For ease of illustration, only some of the trench segments 110 are labeled 110. The cross-sectional view 300 of FIG. 3 may, for example, be taken along line A in FIG. 5A.

The 2D trench array 502 comprises a plurality of rows and a plurality of columns. In some embodiments, the 2D trench array 502 comprises two columns (e.g., in an X dimension) and 8 rows (e.g., in a Y dimension). In alternative embodiments, the 2D trench array 502 has more or less rows and/or more or less columns. In some embodiments, the 2D trench array 502 has mirror symmetry in both dimensions of the 2D trench array 502. For example, the 2D trench array 502 may be symmetric about a first axis equally bisecting the 2D trench array 502 in the X dimension, and may further be symmetric about a second axis equally bisecting the 2D trench array 502 in the Y dimension. In some embodiments, the trench segments 110 share a common layout and/or share a common orientation. The common layout may, for example, be rectangular, square shaped, circular, oval shaped, or some other shape.

Figure 5B:
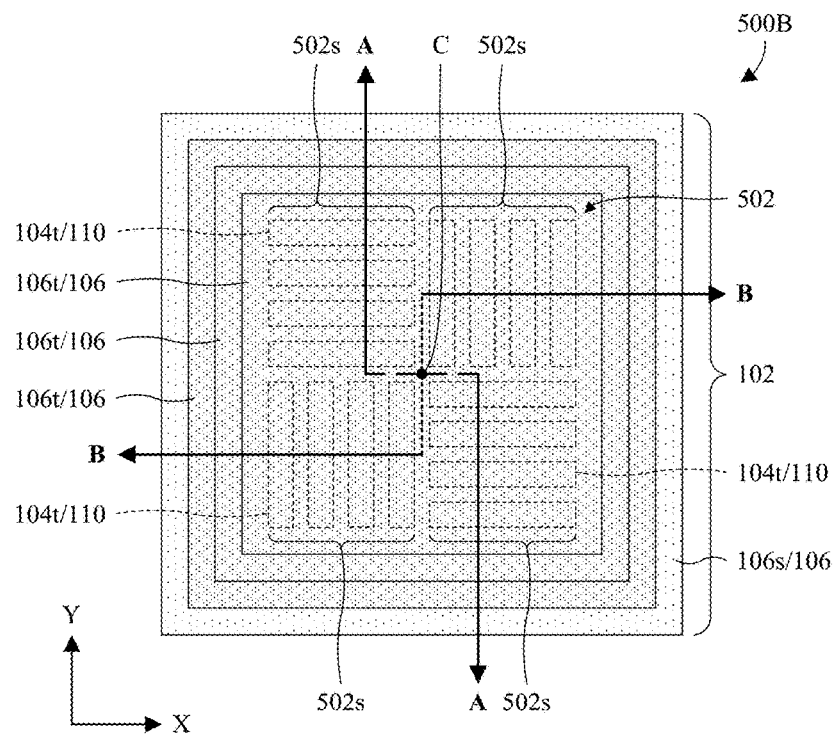
FIG. 5B illustrates a top view of some alternative embodiments of the semiconductor structure of FIG. 5A in which the 2D trench array has rotational symmetry.

With reference to FIG. 5B, a top view 500B of some alternative embodiments of the semiconductor structure of FIG. 5A is provided in which the 2D trench array 502 has rotational symmetry. The cross-sectional view 300 of FIG. 3 may, for example, be taken along a solid portion of line A in FIG. 5B and/or a solid portion of line B in FIG. 5B.

The 2D trench array 502 is divided into N subarrays 502s, where N is an integer greater than 1. Further, the subarrays 502s are each rotated by about R degrees relative to an adjoining one of the subarrays 502s as one rotates about a center C of the 2D trench array 502, where R is the quotient of 360 divided by N. For example, where N equals 4, R equals 90 degrees. The subarrays 502s have the same number of trench segments 110 and each border an outer edge of the 2D trench array 502. In some embodiments, the subarrays 502s share a first common layout and/or share a common size. In some embodiments, the trench segments 110 share a second common layout and/or share a common orientation. The first common layout and/or the second common layout may, for example, each be rectangular, square shaped, circular, oval shaped, or some other shape.

The trench segments 110 may, for example, induce stress on the semiconductor substrate (not shown—see the semiconductor substrate 104 of FIG. 3) in directions perpendicular or transverse to respective lengths of the trench segments 110. Such stress may, for example, lead to warping, breaking, or cracking of the semiconductor substrate when the stress induced by the trench segments 110 is unbalanced. For example, the stress induced by the trench segments 110 may be unbalanced when all of the trench segments 110 have the same orientation. The rotational symmetry balances the stress induced by the trench segments 110 to reduce the likelihood of warping, breaking, or cracking of the semiconductor substrate.

While FIGS. 3, 4, 5A, and 5B are illustrated using trench segments 110 according to the embodiments of FIG. 1, it is to be appreciated that trench segments 110 according to the embodiments of FIGS. 2A and 2B may be used within FIGS. 3, 4, 5A, and 5B in other embodiments. For example, in other embodiments, the trench segments 110 in FIGS. 3 and 4 may each be as the trench segments 110 in FIG. 2A are illustrated and described. As another example, in other embodiments, the trench segments 110 in FIGS. 3 and 4 may each be as the trench segments 110 in FIG. 2B are illustrated and described.

With reference to FIGS. 6-17, a series of cross-sectional views 600-1700 illustrate some embodiments of a method for forming a semiconductor structure comprising a trench capacitor with a high capacitance density. The semiconductor structure may be, or may be part of, an IC, an IPD, or some other semiconductor structure.

Figure 6:
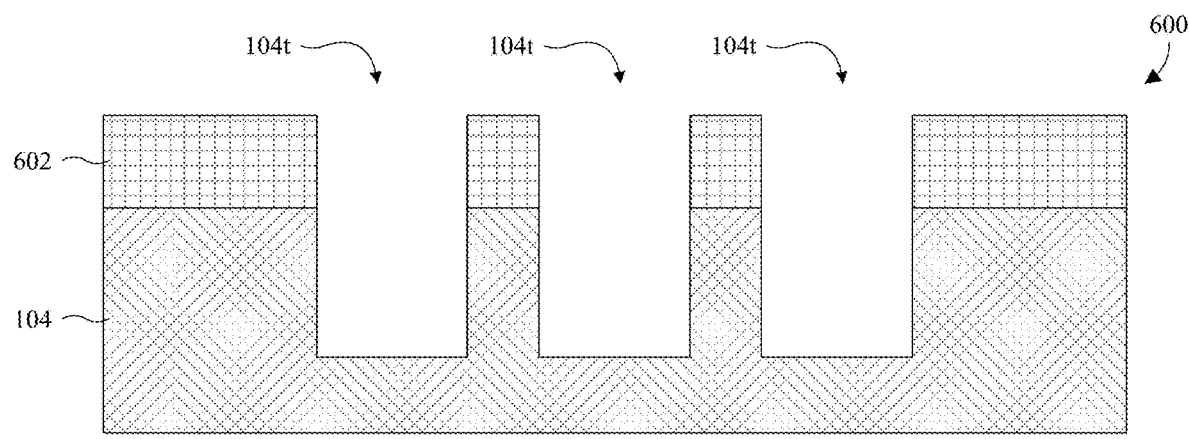
FIGS. 6-17 illustrate a series of cross-sectional views of some embodiments of a method for forming a semiconductor structure comprising a trench capacitor with a high capacitance density.

As illustrated by the cross-sectional view 600 of FIG. 6, a semiconductor substrate 104 is patterned to form a plurality of trenches 104t. In some embodiments, the trenches 104t are arranged in an array when viewed top down (not visible in the cross-sectional view 600 of FIG. 6). The array may, for example, have the same layout as the 2D trench array 502 in any one of FIGS. 5A and 5B. The semiconductor substrate 104 may be or comprise, for example, a bulk semiconductor substrate, a SOI substrate, or some other semiconductor substrate. Further, the semiconductor substrate 104 may be or comprise, for example, monocrystalline silicon, some other silicon, or some other semiconductor material.

In some embodiments, a process for performing the patterning comprises forming a mask 602 over the semiconductor substrate 104 with a layout of the trenches 104t, and subsequently performing an etch into the semiconductor substrate 104 with the mask 602 in place. In some of such embodiments, the process for performing the patterning further comprises removing the mask 602 after the etch. The mask 602 may be or comprise, for example, photoresist, silicon oxide, silicon nitride, some other hard mask material, some other mask material, or any combination of the foregoing. In some embodiments in which the mask 602 is a hard mask material, the forming of the mask comprises depositing or growing a hard mask layer over the semiconductor substrate 104, forming a photoresist mask over the hard mask layer, performing an etch into the hard mask layer with the photoresist mask in place, and removing the photoresist mask after the etch. In some embodiments, the process for performing the patterning is part of a photolithography process.

Figure 7:
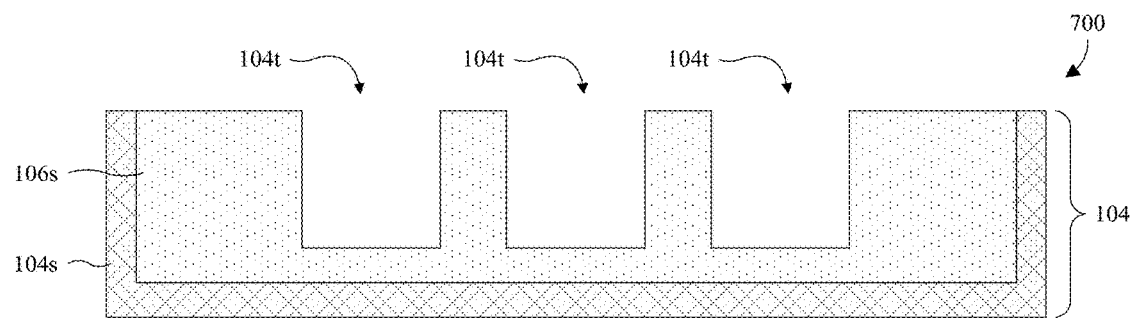

As illustrated by the cross-sectional view 700 of FIG. 7, the semiconductor substrate 104 is doped (e.g., with p-type or n-type dopants) to form a substrate electrode 106s. The substrate electrode 106s is a doped semiconductor region of the semiconductor substrate 104 and is conductive due to the doping. Further, the substrate electrode 106s overlies a surrounding semiconductor region 104s of the semiconductor substrate 104 having a different doping profile. In some embodiments, the substrate electrode 106s has the same doping type (e.g., p-type or n-type) as the surrounding semiconductor region 104s, but has a higher doping concentration than the surrounding semiconductor region 104s. Further, the substrate electrode 106s lines the trenches 104t (see, e.g., FIG. 6) and, in some embodiments, completely separates the trenches 104t from the surrounding semiconductor region 104s. The substrate electrode 106s may, for example, be formed by ion implantation or some other doping process.

Figure 8:
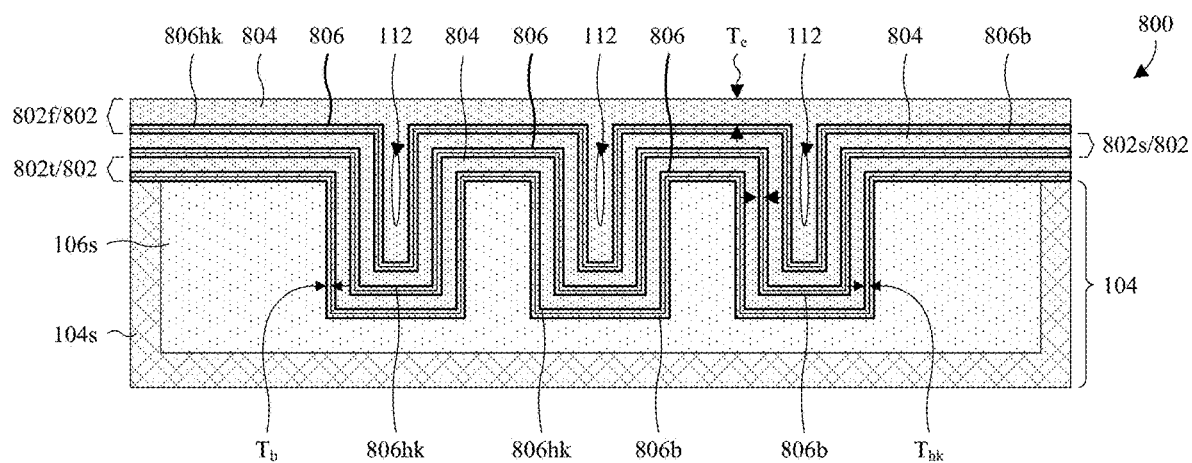

As illustrated by the cross-sectional view 800 of FIG. 8, a plurality of multilayer films 802 are formed on the semiconductor substrate 104. For example, the plurality of multilayer films 802 may comprise a first multilayer film 802f, a second multilayer film 802s, and a third multilayer film 802t. The multilayer films 802 are stacked and line the trenches 104t (see, e.g., FIG. 7). Further, the multilayer films 802 comprise individual electrode layers 804 and individual dielectric layers 806 respectively overlying the electrode layers 804. In some embodiments, each of the electrode and dielectric layers 804, 806 conformally lines the trenches 104t with a uniform or substantially uniform thickness.

The electrode layers 804 are conductive and may be or comprise metal, doped polysilicon, some other conductive material, or any combination of the foregoing. Further, each of the electrode layers 804 has a thickness $T_e$. For ease of illustration, the thickness $T_e$ is only labeled for one of the electrode layers 804. In some embodiments, the thickness $T_e$ is between about 1500-4000 angstroms, about 1500-3250 angstroms, or about 3250-4000 angstroms. In some embodiments, a topmost one of the electrode layers 804 is thicker than a remainder of the electrode layers 804. In some embodiments, the topmost one of the electrode layers 804 defines a closed gap 112 at each of the trenches 104t. The closed gap 112 may, for example, form due to the trenches 104t having a high aspect ratio (i.e., a high ratio of height to width). In some embodiments, the electrode layers 804 are formed by conformal deposition and/or are formed by chemical vapor deposition (CVD), physical vapor deposition (PVD), electroless plating, electroplating, some other deposition or plating process, or any combination of the foregoing.

The dielectric layers 806 are or comprise a high κ dielectric material. The high κ dielectric material has a dielectric constant κ greater than about 10, 20, or 50, and/or may be or comprise, for example, hafnium oxide, zirconium oxide, aluminum oxide, some other high κ dielectric material, or any combination of the foregoing. As seen hereafter, the high κ dielectric material enables the trench capacitor being formed to achieve a high capacitance density (e.g., a capacitance density greater than about 800 nF/mm²) suitable for use with high performance mobile devices. In some embodiments, the dielectric layers 806 are formed by conformal deposition and/or are formed by CVD, PVD, atomic layer deposition (ALD), some other deposition process, or any combination of the foregoing.

In some embodiments, the dielectric layers 806 each comprise a high κ dielectric layer 806hk and a base dielectric layer 806b. For ease of illustration, the high κ dielectric layer 806hk is only labeled for one of the dielectric layers 806, and the base dielectric layer 806b is only labeled for some of the dielectric layers 806. The high κ dielectric layer 806hk overlies the base dielectric layer 806b and is or comprises the high κ dielectric material described above.

Further, the high κ dielectric layer 806*hk* has a thickness $T_{hκ}$. For ease of illustration, the thickness $T_{hκ}$ is only labeled for the high κ dielectric layer 806*hk* of one of the dielectric layers 806. In some embodiments, the thickness $T_{hκ}$ is between about 25-50 angstroms, about 25-35 angstroms, or about 35-50 angstroms.

The base dielectric layer 806*b* underlies the high κ dielectric layer 806*hk* and is or comprises a material with a dielectric constant κ less than that of silicon nitride and/or less than about 10, 6, or 3.9. For example, the base dielectric layer 806*b* may be or comprise silicon oxide, silicon nitride, some other dielectric, or any combination of the foregoing. Further, the base dielectric layer 806*b* has a dielectric constant κ less than that of the high κ dielectric layer 806*hk* and has a thickness $T_b$. For ease of illustration, the thickness $T_b$ is only labeled for the base dielectric layer 806*b* of one of the dielectric layers 806. In some embodiments, the thickness $T_b$ is between about 20-40 angstroms, about 20-30 angstroms, or about 30-40 angstroms. The base dielectric layer 806*b* provides enhanced electrical insulation between the high κ dielectric layer 806*hk* and the electrode layers 804, which leads to a reduction in leakage current for the trench capacitor 102 being formed. In some embodiments, the dielectric layers 806 are formed by conformal deposition and/or are formed by CVD, PVD, thermal oxidation, some other deposition or oxidation process, or any combination of the foregoing.

Figure 9:
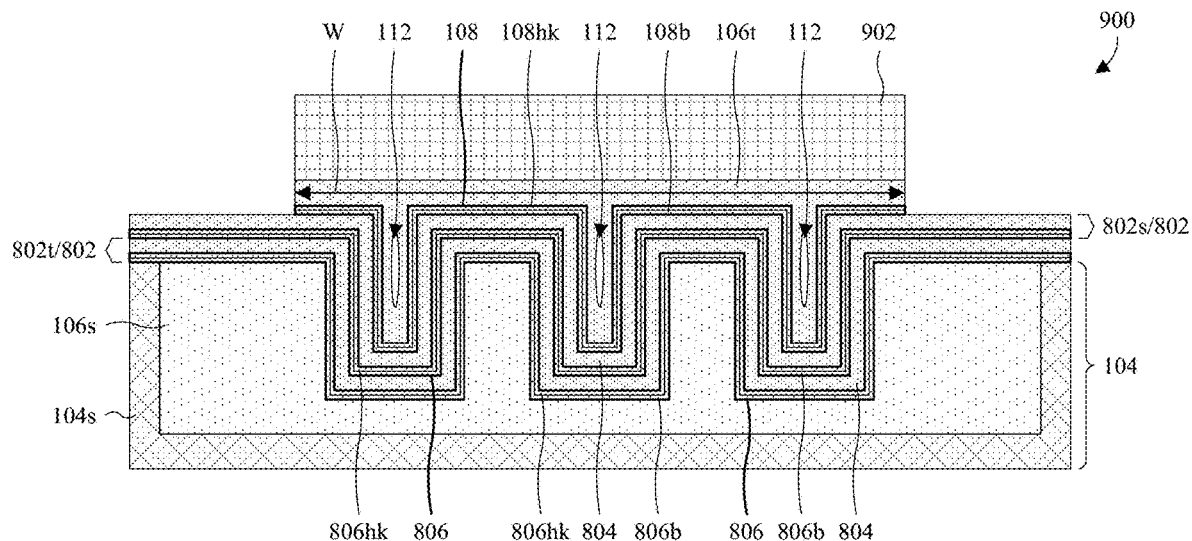
Figure 10:
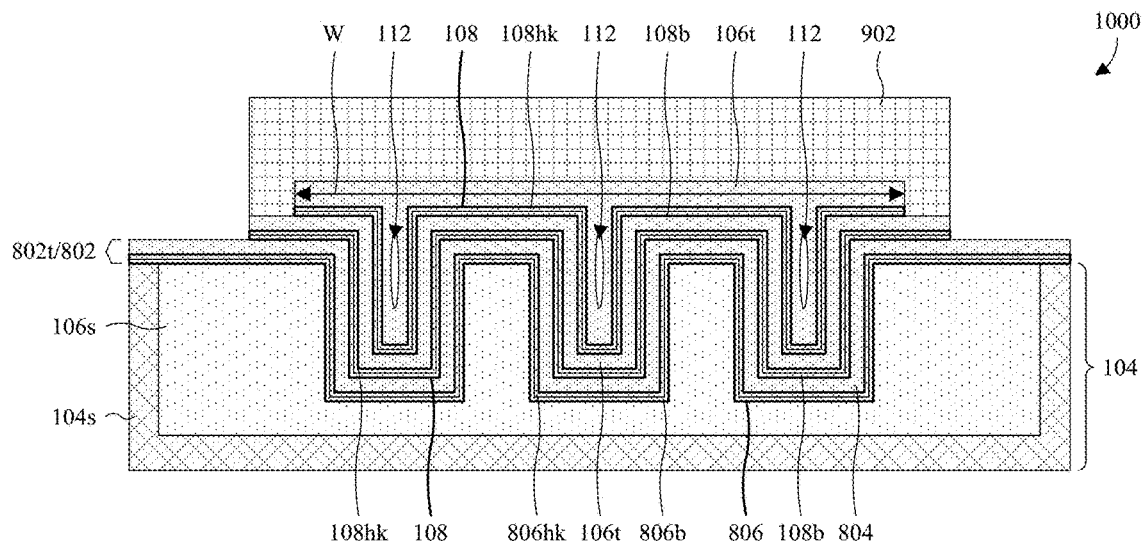
Figure 11:
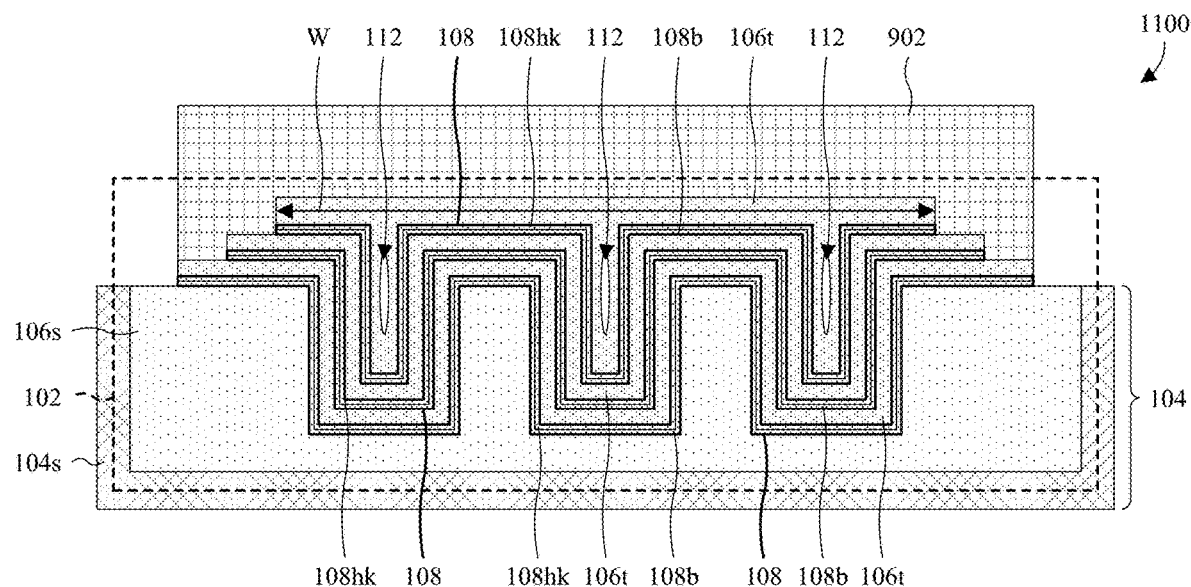

As illustrated by the cross-sectional views 900-1100 of FIGS. 9-11, the multilayer films 802 are patterned one by one from a topmost one of the multilayer films 802 to a bottommost one of the multilayer films 802. For example, the first multilayer film 802*f* (see, e.g., FIG. 8) may be patterned at FIG. 9, followed by the second multilayer film 802*s* (see, e.g., FIG. 9) at FIG. 10, followed by the third multilayer film 802*t* (see, e.g., FIG. 10) at FIG. 11. The patterning forms a plurality of trench electrodes 106*t* and a plurality of capacitor dielectric layers 108 on the substrate electrode 106*s*.

The trench electrodes 106*t* are respectively formed from the electrode layers 804 and are alternatingly stacked with the capacitor dielectric layers 108. The trench electrodes 106*t* increase in width W from a topmost one of the trench electrodes 106*t* to a bottommost one of the trench electrodes 106*t*. In some embodiments, the width W of the bottommost one of the trench electrodes 106*t* is less than that of the substrate electrode 106*s*. In some embodiments, each of the trench electrodes 106*t* completely overlies an immediately underlying electrode (e.g., the substrate electrode 106*s* or another one of the trench electrodes 106*t*), and/or is laterally offset from neighboring sidewalls of the immediately underlying electrode.

The capacitor dielectric layers 108 are respectively formed from the dielectric layers 806 and are or comprise a high κ dielectric material. As above, the high κ dielectric material has a dielectric constant κ greater than about 10, 20, or 50, and/or may be or comprise, for example, hafnium oxide, zirconium oxide, aluminum oxide, some other high κ dielectric material, or any combination of the foregoing. In some embodiments, the capacitor dielectric layers 108 have the same width W as an immediately overlying one of the trench electrodes 106*t*. In some embodiments, the capacitor dielectric layers 108 comprise individual base capacitor dielectric layers 108*b*, and further comprise individual high κ capacitor dielectric layers 108*hk* respectively overlying the base capacitor dielectric layers 108*b*. The base capacitor dielectric layers 108*b* are respectively formed from the base dielectric layers 806*b*, whereas the high κ capacitor dielectric layers 108*hk* are respectively formed from the high κ dielectric layers 806*hk*.

In some embodiments, a process for performing the patterning of the multilayer films 802 comprises performing an etching process individually on each of the multilayer films 802. In some embodiments, the etching process comprises: forming a mask 902 over a multilayer film 802 with a layout of a trench electrode 106*t* and a capacitor dielectric layer 108 to be formed, performing an etch into the multilayer film 802 with the mask 902 in place to form the trench electrode 106*t* and the capacitor dielectric layer 108, and removing the mask 902 after the etch. The mask 902 may be or comprise, for example, photoresist and/or some other mask material. In some embodiments, the etching process is performed as part of a photolithography process.

The substrate electrode 106*s*, the trench electrodes 106*t*, and the capacitor dielectric layers 108 collectively define a trench capacitor 102. Because the capacitor dielectric layers 108 are or comprise a high κ dielectric material, the trench capacitor 102 has a high capacitance density suitable for use with high performance mobile devices. The high capacitance density may, for example, be a capacitance density greater than about 800, 900, or 1000 nF/mm$^2$. Additionally, in embodiments in which the capacitor dielectric layers 108 comprise the base capacitor dielectric layers 108*b*, the trench capacitor 102 has enhanced electrical insulation between electrodes (e.g., the substrate and trench electrodes 106*s*, 106*t*) to reduce leakage current, thereby enhancing performance and power efficiency of the trench capacitor 102.

Figure 12:
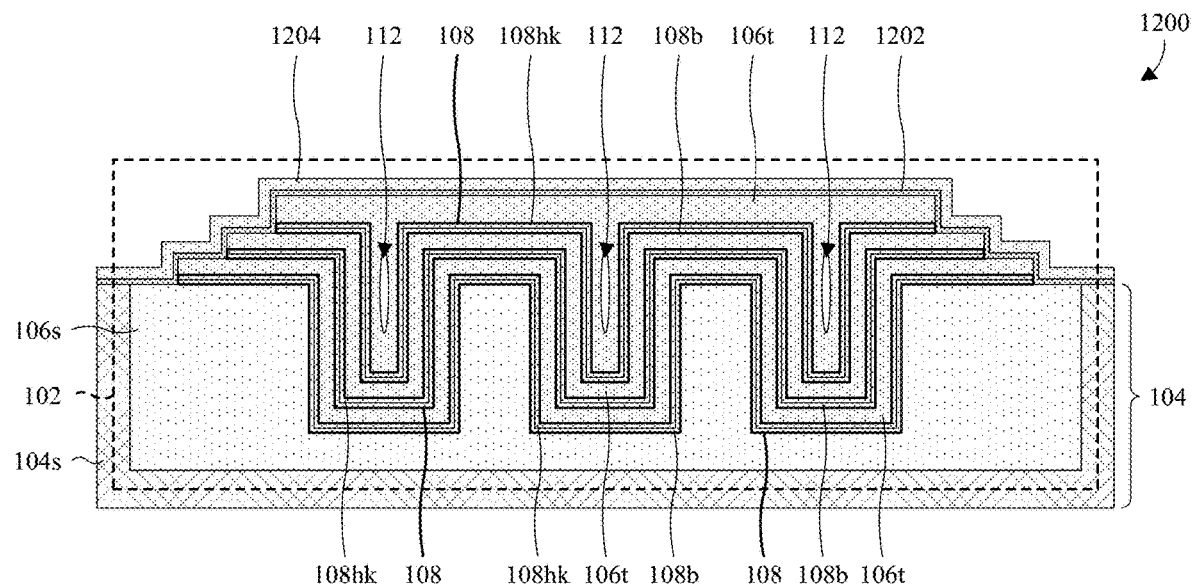

As illustrated by the cross-sectional view 1200 of FIG. 12, a spacer liner layer 1202 and a spacer layer 1204 are formed overlying and lining the trench capacitor 102. The spacer liner layer 1202 is a different material than the spacer layer 1204 and underlies the spacer layer 1204. The spacer liner layer 1202 may be or comprise, for example, silicon oxide and/or some other dielectric material. The spacer layer 1204 may be or comprise, for example, silicon nitride and/or some other dielectric material. In some embodiments, the spacer liner layer 1202 and the spacer layer 1204 are formed by conformal deposition and/or are formed by CVD, PVD, ALD, some other deposition process, or any combination of the foregoing.

Figure 13:
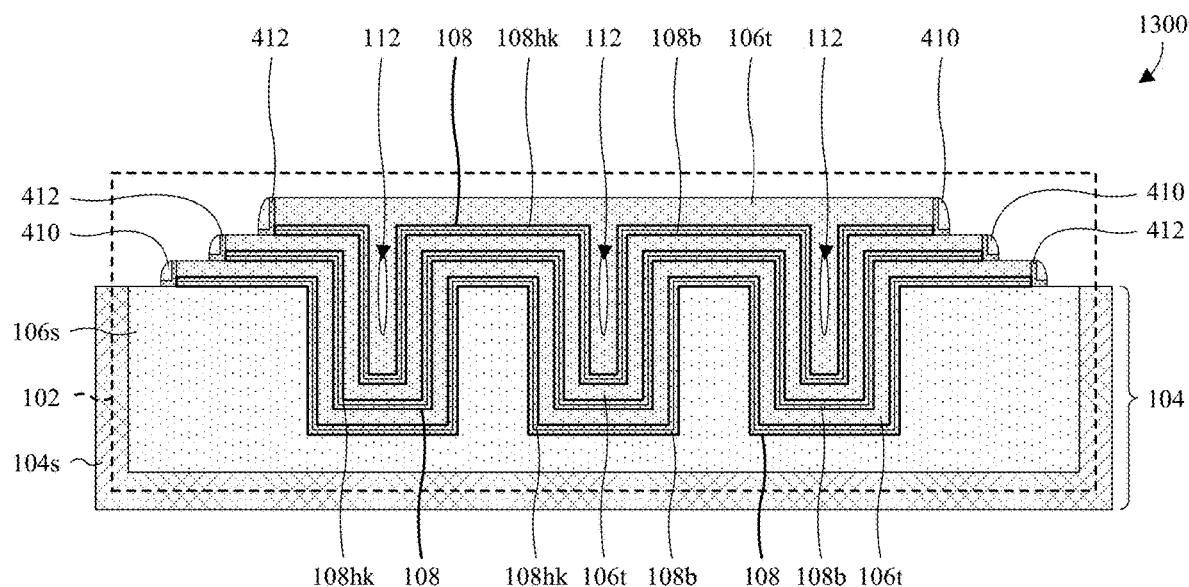

As illustrated by the cross-sectional view 1300 of FIG. 13, the spacer layer 1204 (see, e.g., FIG. 12) is etched back to form spacers 410 on sidewalls of the trench electrodes 106*t*. For ease of illustration, only some of the spacers 410 are labeled 410. In some embodiments, the etch back comprises applying an etchant to the spacer layer 1204 to remove horizontal segments of the spacer layer 1204, while leaving vertical segments of the spacer layer 1204 that correspond to the spacers 410.

Also illustrated by the cross-sectional view 1300 of FIG. 13, the spacer liner layer 1202 (see, e.g., FIG. 12) is patterned to form spacer liners 412. For ease of illustration, only some of the spacer liners 412 are labeled 412. The spacer liners 412 respectively line the spacers 410, and further separate the spacers 410 from the substrate electrode 106*s* and the trench electrodes 106*t*. In some embodiments, the patterning is performed by continuing the etch back of the spacer layer 1204 into the spacer liner layer 1202. In other embodiments, the patterning is performed by an etching process independent of the etch back using the spacers 410 as a mask. In some of these other embodiments, the spacer liner layer 1202 may, for example, serve as an etch stop for the etch back.

Figure 14:
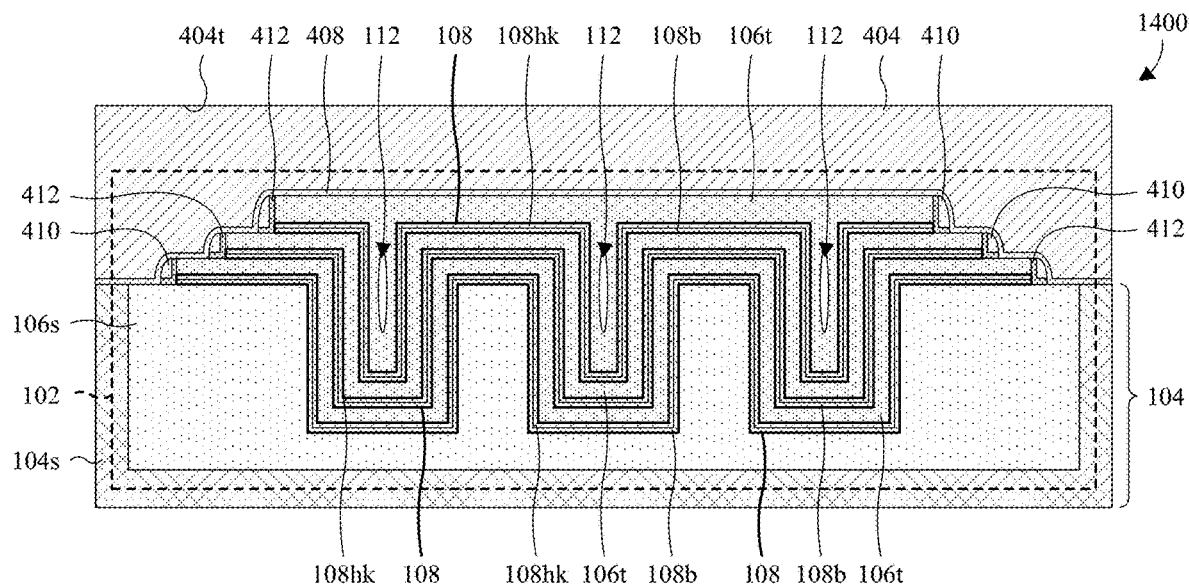

As illustrated by the cross-sectional view 1400 of FIG. 14, an etch stop layer 408 is formed overlying and lining the trench capacitor 102 and the spacers 410. The etch stop layer 408 may be or comprise, for example, silicon oxide, silicon nitride, silicon carbide, silicon oxynitride, some other dielectric material, or any combination of the foregoing. The etch stop layer 408 may be formed by conformal deposition and/or formed by CVD, PVD, ALD, some other deposition process, or any combination of the foregoing.

Also illustrated by the cross-sectional view 1400 of FIG. 14, an ILD layer 404 is formed over the etch stop layer 408 and with a top surface 404t that is flat or substantially flat. The ILD layer 404 may be or comprise, for example, silicon dioxide, silicon nitride, silicon carbide, a low κ dielectric, some other dielectric material, or any combination of the foregoing. In some embodiments, a process for forming the ILD layer 404 comprises depositing the ILD layer 404 over the etch stop layer 408, and subsequently performing a planarization into the top surface 404t of the ILD layer 404. The deposition may, for example, be performed by CVD, PVD, ALD, some other deposition process, or any combination of the foregoing. The planarization may, for example, be performed by a chemical mechanical polish (CMP) or some other planarization process.

Figure 15:
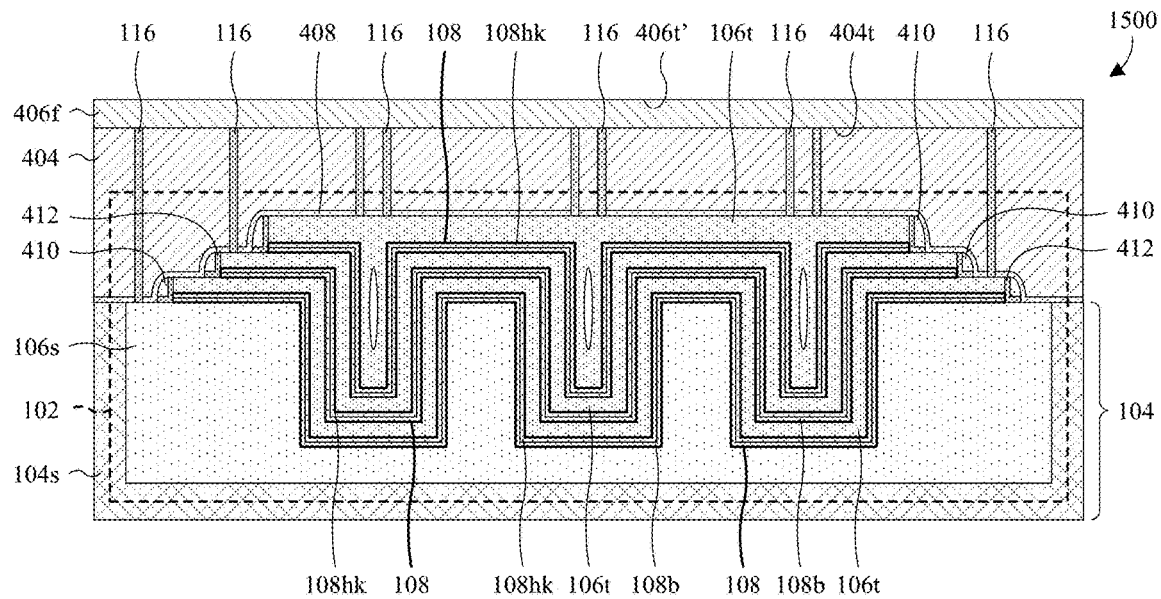

As illustrated by the cross-sectional view 1500 of FIG. 15, a plurality of vias 116 are formed extending through the ILD layer 404 and the etch stop layer 408 to the substrate electrode 106s and the trench electrodes 106t. For ease of illustration, only some of the vias 116 are labeled 116. The vias 116 may be or comprise, for example, copper, aluminum copper, aluminum, tungsten, some other conductive material, or any combination of the foregoing.

In some embodiments, a process for forming the vias 116 comprise performing an etch into the ILD layer 404 to form via openings corresponding to the vias 116. The etch stop layer 408 may, for example, serve as an etch stop for the etch, and/or the etch may, for example, be performed as part of a photolithography process. In some embodiments, the process further comprises forming a conductive layer filling the via openings and overlying the ILD layer 404, and subsequently performing a planarization into the conductive layer until the top surface 404t of the ILD layer 404 is reached to form the vias 116 from the conductive layer. The conductive layer may, for example, be formed by CVD, PVD, electroless plating, electroplating, some other deposition or plating process, or any combination of the foregoing. The planarization may, for example, be formed by a CMP or some other planarization process.

Also illustrated by the cross-sectional view 1500 of FIG. 15, a first IMD layer 406f is formed over the ILD layer 404 and the vias 116. The first IMD layer 406f is formed with a top surface 406t' that is flat or substantially flat. The first IMD layer 406f may, for example, be a different material than the ILD layer 404 and/or may be or comprise, for example, silicon dioxide, silicon nitride, silicon carbide, a low κ dielectric, some other dielectric material, or any combination of the foregoing. In some embodiments, a process for forming the first IMD layer 406f is the same as the process described for forming the ILD layer 404 at FIG. 14.

Figure 16:
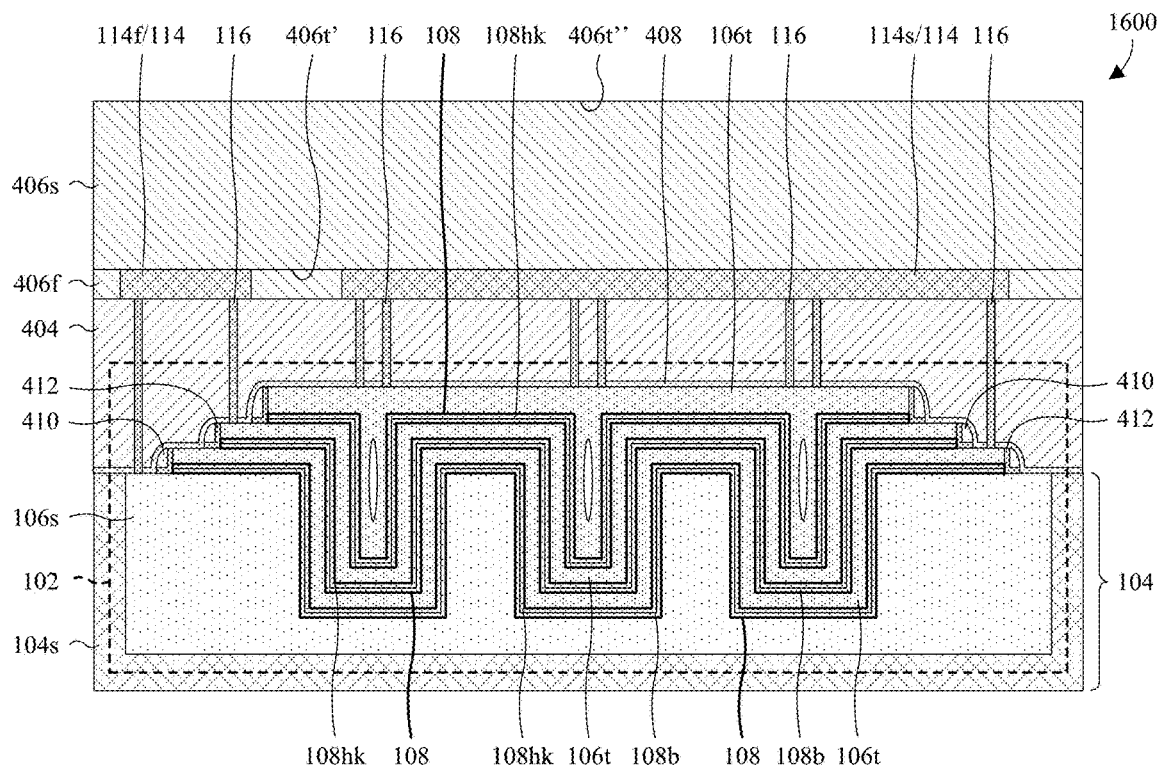

As illustrated by the cross-sectional view 1600 of FIG. 16, a plurality of wires 114 is formed in the first IMD layer 406f. The plurality of wires 114 comprises a first capacitor wire 114f and a second capacitor wire 114s. The first capacitor wire 114f is electrically coupled to every other electrode of the trench capacitor 102 by the vias 116, from a bottom of the trench capacitor 102 to a top of the trench capacitor 102. The second capacitor wire 114s is electrically coupled to a remainder of the electrodes by the vias 116. The electrodes include the substrate electrode 106s and the trench electrodes 106t. The wires 114 may be or comprise, for example, copper, aluminum copper, aluminum, some other metal, some other conductive material, or any combination of the foregoing.

In some embodiments, a process for forming the wires 114 comprise performing an etch into the first IMD layer 406f to form wire openings corresponding to the wires 114. In some embodiments, the process further comprises forming a conductive layer filling the wire openings and overlying the first IMD layer 406f, and subsequently performing a planarization into the conductive layer until the top surface 406t' of the first IMD layer 406f is reached to form the wires 114 from the conductive layer. The conductive layer may, for example, be formed by CVD, PVD, electroless plating, electroplating, some other deposition or plating process, or any combination of the foregoing. The planarization may, for example, be formed by a CMP or some other planarization process.

Also illustrated by the cross-sectional view 1600 of FIG. 16, a second IMD layer 406s is formed over the first IMD layer 406f and the wires 114. The second IMD layer 406s is formed with a top surface 406t" that is flat or substantially flat. The second IMD layer 406s may, for example, be a different material than the ILD layer 404 and/or may be or comprise, for example, silicon dioxide, silicon nitride, silicon carbide, a low κ dielectric, some other dielectric material, or any combination of the foregoing. In some embodiments, a process for forming the second IMD layer 406s is the same as the process described for forming the ILD layer 404 at FIG. 14.

Figure 17:
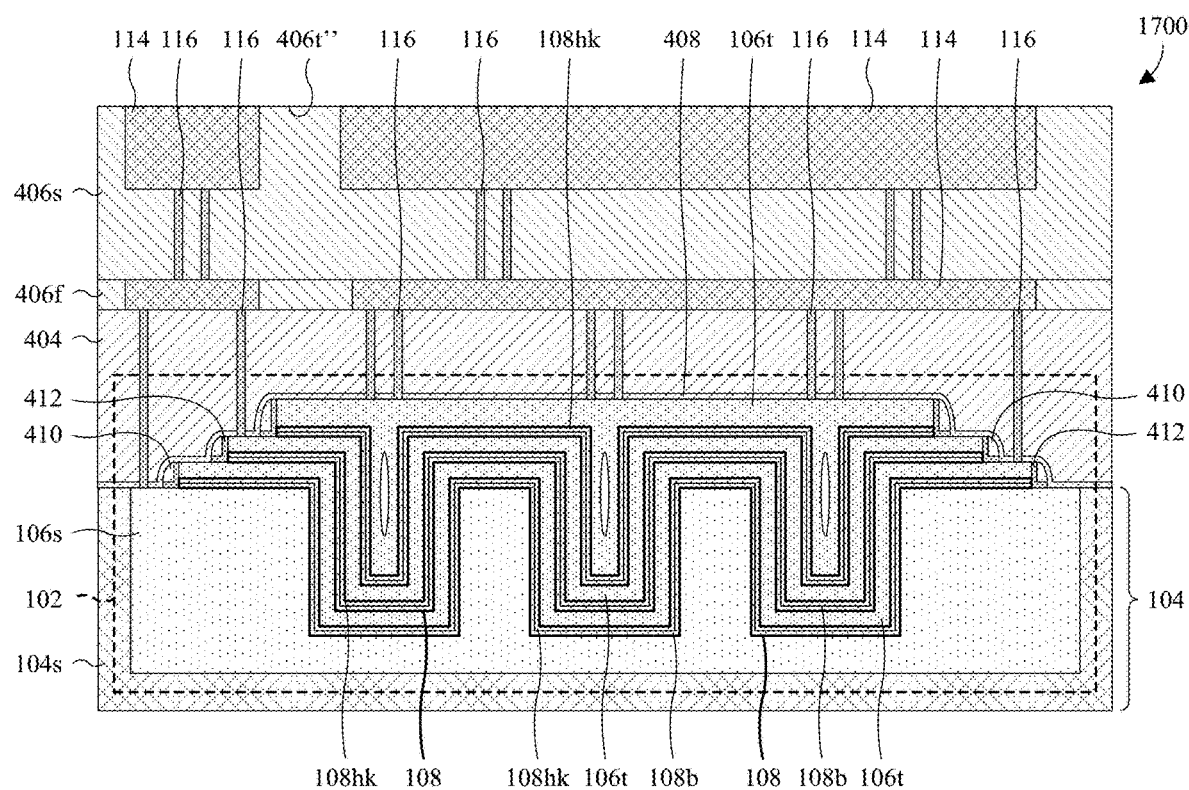

As illustrated by the cross-sectional view 1700 of FIG. 17, a plurality of additional wires 114 and a plurality of additional vias 116 are formed in the second IMD layer 406s. The additional wires 114 and the additional vias 116 may be or comprise, for example, copper, aluminum copper, aluminum, some other metal, some other conductive material, or any combination of the foregoing.

In some embodiments, a process for forming the additional wires 114 and the additional vias 116 comprise performing a series of etches into the second IMD layer 406s to form wire/via openings. Each wire/via openings has an upper segment corresponding to one of the additional wires 114, and further has one or more lower segments underlying the upper segment and corresponding to one or more of the additional vias 116. In some embodiments, the process further comprises forming a conductive layer filling the wire/via openings and overlying the second IMD layer 406s, and subsequently performing a planarization into the conductive layer until the top surface 406t" of the second IMD layer 406s is reached to form the additional wires 114 and the additional vias 116 from the conductive layer. The conductive layer may, for example, be formed by CVD, PVD, electroless plating, electroplating, some other deposition or plating process, or any combination of the foregoing. The planarization may, for example, be formed by a CMP or some other planarization process.

While FIGS. 6-17 illustrate the formation of the trench capacitor 102 using three trenches 104t (see, e.g., FIG. 6), more or less trenches 104t are amenable in other embodiments. While FIGS. 6-17 illustrate the formation of the trench capacitor 102 from three multilayer films 802 (see, e.g., FIG. 8), more or less multilayer films 802 are amenable in other embodiments. While FIGS. 6-17 illustrate the formation of trench capacitor 102 with the substrate electrode 106s (see, e.g., FIG. 6), the substrate electrode 106s may be omitted in other embodiments. While FIGS. 6-17 illustrate the formation of the trench capacitor 102 from dielectric layers 806 having the base dielectric layers 806b (see, e.g., FIG. 8) and the high κ dielectric layers (see, e.g., FIG. 8), the base dielectric layers 806b may be omitted one, some, or all of the dielectric layers 806 in other embodiments.

In some embodiments, the method of FIGS. 6-17 is limited to low temperatures once the dielectric layers 806 are formed at FIG. 8. High temperatures may damage high κ dielectric material of the dielectric layers 806 (see, e.g., FIG. 8) and/or may damage high κ dielectric material of the capacitor dielectric layers 108 (see, e.g., FIG. 11). In some embodiments, the method is performed wholly at the low temperatures. The low temperatures may, for example, be furnace temperatures less than about 450, 550, or 650 degrees Celsius and/or rapid thermal anneal temperatures less than about 700, 800, or 900 degrees Celsius. In some embodiments, no metal-oxide-semiconductor (MOS) devices are formed in the semiconductor substrate 104, and/or no high temperature anneals are performed to activate dopants (e.g., of MOS devices) in the semiconductor substrate 104, once the dielectric layers 806 are formed at FIG. 8, thereby preventing the dielectric layers 806 and the capacitor dielectric layers 108 from being damaged by high temperatures. Further, in some embodiments, only trench capacitors are formed in the semiconductor substrate 104 to prevent the dielectric layers 806 and the capacitor dielectric layers 108 from being damaged high temperatures.

By limiting the method of FIGS. 6-17 to the low temperatures, high κ dielectric material of the dielectric layers 806 (see, e.g., FIG. 8) and high κ dielectric material of the capacitor dielectric layers 108 (see, e.g., FIG. 11) are not damaged by high temperatures. Such high temperatures may, for example, be furnace temperatures greater than about 650 degrees Celsius and rapid thermal anneal temperatures greater than about 900 degrees Celsius. As a result, leakage current through the high κ dielectric material of the capacitor dielectric layers 108 is low, and the trench capacitor 102 has high performance and high power efficiency.

Figure 18:
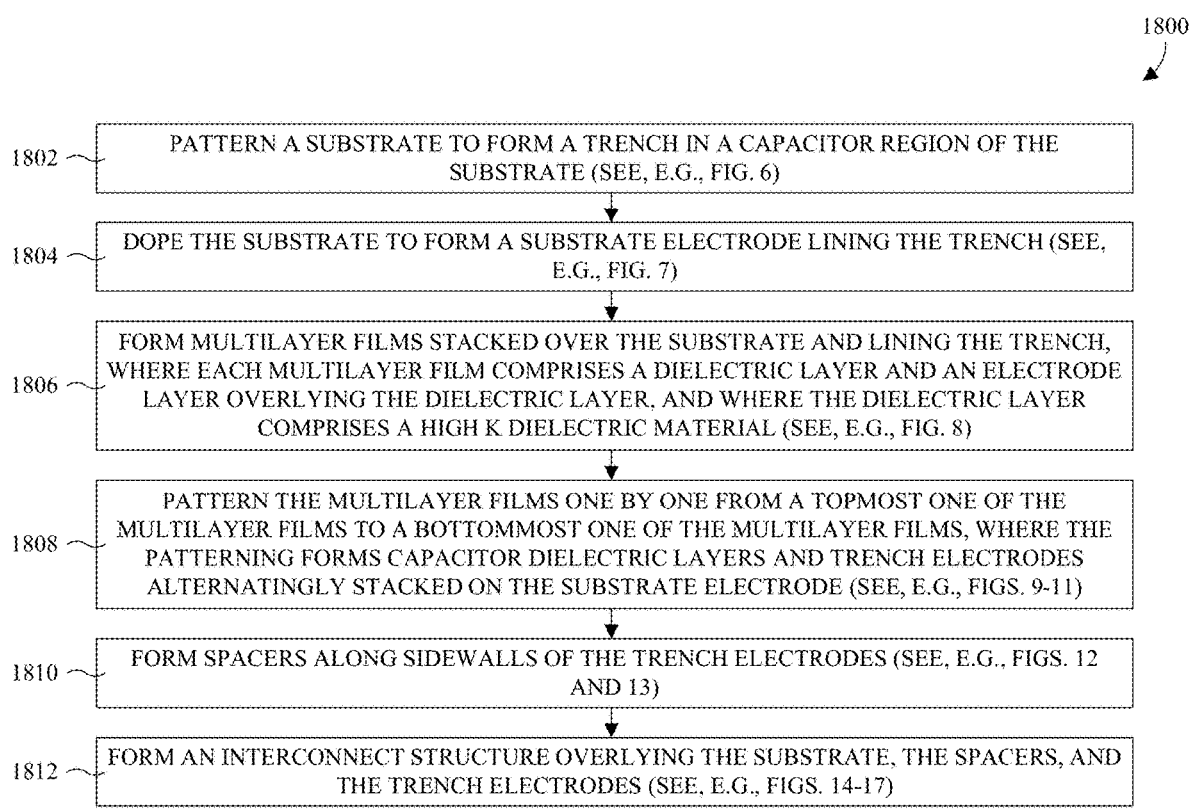
FIG. 18 illustrates a block diagram of some embodiments of the method of FIGS. 6-17.

With reference to FIG. 18, a block diagram 1800 of some embodiments the method of FIGS. 6-17 is provided.

At 1802, a substrate is patterned to form a trench in a capacitor region of the substrate. See, for example, FIG. 6.

At 1804, the substrate is doped to form a substrate electrode lining the trench. See, for example, FIG. 7.

At 1806, multilayer films are formed stacked over the substrate and lining the trench. Each multilayer film comprises a dielectric layer and an electrode layer overlying the dielectric layer, and the dielectric layer comprises a high k dielectric material. See, for example, FIG. 8.

At 1808, the multilayer films are patterned one by one from a topmost one of the multilayer films to a bottommost one of the multilayer films. The patterning forms capacitor dielectric layers and trench electrodes alternatingly stacked on the substrate electrode. See, for example, FIGS. 9-11. Because the dielectric layers of the multilayer films comprise a high k dielectric material, the capacitor dielectric layers comprise the high k dielectric material. Further, the trench capacitor formed in part by the capacitor dielectric layers has a high capacitance density.

At 1810, spacers are formed along sidewalls of the trench electrodes. See, for example, FIGS. 12 and 13.

At 1812, an interconnect structure is formed overlying the substrate, the spacers, and the trench electrodes. See, for example, FIGS. 14-17.

While the block diagram 1800 of FIG. 18 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides a semiconductor structure including: a substrate defining a trench; and a trench capacitor overlying the substrate and filling the trench, wherein the trench capacitor includes: a lower capacitor electrode; a base capacitor dielectric layer overlying the lower capacitor electrode and lining the trench; a high κ capacitor dielectric layer overlying the base capacitor dielectric layer and lining the trench over the base capacitor dielectric layer, wherein the high κ capacitor dielectric layer has a dielectric constant κ greater than that of the base capacitor dielectric layer; and an upper capacitor electrode overlying the high κ capacitor dielectric layer and lining the trench over the high κ capacitor dielectric layer. In some embodiments, the high κ capacitor dielectric layer has a dielectric constant κ greater than about 10. In some embodiments, the high κ capacitor dielectric layer has a dielectric constant κ greater than that of silicon nitride. In some embodiments, the high κ capacitor dielectric layer includes hafnium oxide, zirconium oxide, or aluminum oxide. In some embodiments, the trench capacitor has a capacitance density greater than about 800 nF/mm². In some embodiments, the base capacitor dielectric layer includes silicon oxide. In some embodiments, the upper capacitor electrode includes a gap in the trench. In some embodiments, the upper capacitor electrode includes doped polysilicon. In some embodiments, the lower capacitor electrode is defined by a doped semiconductor region of the substrate.

In some embodiments, the present application provides a method for forming a trench capacitor, the method including: performing an etch into a substrate to form a trench; forming a lower capacitor electrode along sidewalls of the trench; forming a dielectric layer overlying the substrate and the lower capacitor electrode, and further lining the trench over the lower capacitor electrode, wherein the dielectric layer includes a high κ dielectric material; forming an electrode layer overlying the dielectric layer and lining the trench over the dielectric layer; and patterning the electrode layer and the dielectric layer to respectively form an upper capacitor electrode and a capacitor dielectric layer stacked on the lower capacitor electrode. In some embodiments, the high κ dielectric material has a dielectric constant κ greater than about 10. In some embodiments, the forming of the dielectric layer includes: depositing a base dielectric layer overlying the substrate and the lower capacitor electrode, and further lining the trench over the lower capacitor electrode, wherein the base dielectric layer has a dielectric constant less than that of the high κ dielectric material; and depositing a high κ dielectric layer overlying the base dielectric layer and lining the trench over the base dielectric layer, wherein the high κ dielectric layer includes the high κ dielectric material. In some embodiments, the base dielectric layer includes silicon oxide, wherein the high κ dielectric layer includes hafnium oxide, zirconium oxide, or aluminum oxide. In some embodiments, the forming of the lower capacitor electrode includes doping the substrate after the etch to form a doped semiconductor region in the substrate, wherein the doped semiconductor region defines the lower capacitor electrode. In some embodiments, the method further includes forming a interconnect structure covering the substrate, the lower capacitor electrode, the upper capacitor electrode, and the capacitor dielectric layer, wherein the dielectric layer and the capacitor dielectric layer are not exposed to high furnace temperatures between the forming of the dielectric layer and the forming of the interconnect structure, and wherein the high furnace temperatures are temperatures greater than about 650 degrees Celsius. In some embodiments, the method further includes forming a interconnect structure covering the substrate, the lower capacitor electrode, the upper capacitor electrode, and the capacitor dielectric layer, and wherein there is no annealing of the substrate to activate dopants in the substrate between the forming of the dielectric layer and the forming of the interconnect structure.

In some embodiments, the present application provides another a semiconductor structure including: a substrate; and a trench capacitor overlying the substrate, wherein the trench capacitor includes a substrate electrode, a plurality of trench electrodes, and a plurality of capacitor dielectric layers, wherein the substrate electrode is defined by a doped region of the substrate, wherein the trench electrodes and the capacitor dielectric layers are alternatingly stacked over the substrate electrode and define a plurality of trench segments that protrude into the substrate, wherein the trench electrodes and the capacitor dielectric layers are recessed into the substrate at the trench segments, and wherein the capacitor dielectric layers include a high κ dielectric material. In some embodiments, the high κ dielectric material has a dielectric constant κ greater than that of silicon nitride. In some embodiments, the trench electrodes increase in width from a topmost one of the trench electrodes to a bottommost one of the trench electrodes, wherein the substrate electrode has a greater width than the bottommost one of the trench electrodes. In some embodiments, the capacitor dielectric layers each include a silicon oxide layer and a high κ dielectric layer overlying the silicon oxide layer, wherein the high κ dielectric layer includes the high κ dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a substrate defining a trench; and
a trench capacitor overlying the substrate and filling the trench, wherein the trench capacitor comprises:
a lower capacitor electrode;
a base capacitor dielectric layer overlying the lower capacitor electrode and lining the trench;
a first high κ capacitor dielectric layer and a second high κ capacitor dielectric layer each overlying the base capacitor dielectric layer and lining the trench over the base capacitor dielectric layer, wherein the first high κ capacitor dielectric layer has a dielectric constant κ greater than that of the base capacitor dielectric layer, and wherein the first and second high κ capacitor dielectric layers comprise the same material;
an intermediate capacitor electrode overlying, and lining the trench over, the lower capacitor electrode;
an upper capacitor electrode overlying the first and second high κ capacitor dielectric layers and the intermediate capacitor electrode, and further lining the trench over the first and second high κ capacitor dielectric layers and the intermediate capacitor electrode; and
a plurality of pairs of neighboring capacitor electrodes defined by the lower, intermediate, and upper capacitor electrodes and comprising a first pair and a second pair, wherein the first high κ capacitor dielectric layer and the base capacitor dielectric layer are the only dielectric layers between neighboring capacitor electrodes of the first pair, and wherein the second high κ capacitor dielectric layer is the only dielectric layer between neighboring capacitor electrodes of the second pair.

2. The semiconductor structure according to claim 1, wherein the first high κ capacitor dielectric layer has a dielectric constant κ greater than about 10.

3. The semiconductor structure according to claim 1, wherein the trench capacitor has a capacitance density greater than about 800 nanofarad per squared millimeter (nF/mm$^2$).

4. The semiconductor structure according to claim 1, wherein the base capacitor dielectric layer comprises silicon oxide.

5. The semiconductor structure according to claim 1, wherein the upper capacitor electrode includes a gap in the trench.

6. The semiconductor structure according to claim 1, wherein the upper capacitor electrode comprises doped polysilicon.

7. The semiconductor structure according to claim 1, wherein the lower capacitor electrode is defined by a doped semiconductor region of the substrate.

8. The semiconductor structure according to claim 1, wherein the base capacitor dielectric layer comprises silicon nitride, and wherein the first high κ capacitor dielectric layer comprises hafnium oxide, zirconium oxide, or aluminum oxide.

9. The semiconductor structure according to claim 1, wherein the trench capacitor defines a trench array comprising a plurality of trench segments, wherein the plurality of trench segments extend into the substrate and comprise a first trench segment filling the trench, wherein the trench array comprises a plurality of subarrays, wherein trench segments in each of the subarrays are laterally elongated crosswise to a direction along which trench segments in adjacent subarrays are laterally elongated, such that the trench array has a rotational symmetry about a center of the trench array.

10. A method for forming a trench capacitor, the method comprising:
performing an etch into a substrate to form a trench, wherein the substrate comprises monocrystalline silicon;
forming a lower capacitor electrode along sidewalls of the trench;
forming a dielectric layer overlying the substrate and the lower capacitor electrode, and further lining the trench over the lower capacitor electrode, wherein the dielectric layer directly contacts the substrate and the lower capacitor electrode, wherein the dielectric layer consists essentially of a base dielectric layer and a high κ dielectric layer overlying the base dielectric layer, wherein the base dielectric layer is silicon nitride, and wherein the high κ dielectric layer is a high κ dielectric material with a dielectric constant greater than that of the base dielectric layer and also with a coefficient of thermal expansion greater than that of the base dielectric layer and that of the substrate;

forming an electrode layer overlying and directly contacting the dielectric layer and lining the trench over the dielectric layer; and patterning the electrode layer and the dielectric layer to respectively form an upper capacitor electrode and a capacitor dielectric layer stacked on the lower capacitor electrode.

11. The method according to claim 10, wherein the etch forms a trench array comprising a plurality of trenches, including the trench, extending into the substrate, wherein the trench array comprises a plurality of subarrays, wherein trenches in each of the subarrays are laterally elongated crosswise to a direction along which trenches in adjacent subarrays are laterally elongated, such that the trench array has a rotational symmetry about a center of the trench array, and wherein the dielectric layer and the electrode layer are formed lining each trench in the trench array.

12. The method according to claim 11, wherein the high κ dielectric layer has a thickness that is between about 25 to 50 angstroms.

13. The method according to claim 12, wherein the high κ dielectric layer comprises hafnium oxide, zirconium oxide, or aluminum oxide.

14. The method according to claim 11, wherein the forming of the lower capacitor electrode comprises doping the substrate after the etch to form a doped semiconductor region in the substrate, and wherein the doped semiconductor region defines the lower capacitor electrode.

15. The method according to claim 11, further comprising:

forming an interconnect structure covering the substrate, the lower capacitor electrode, the upper capacitor electrode, and the capacitor dielectric layer, wherein the dielectric layer and the capacitor dielectric layer are not exposed to high furnace temperatures between the forming of the dielectric layer and the forming of the interconnect structure, and wherein the high furnace temperatures are temperatures greater than about 650 degrees Celsius.

16. The method according to claim 11, further comprising:

forming an interconnect structure covering the substrate, the lower capacitor electrode, the upper capacitor electrode, and the capacitor dielectric layer, and wherein there is no annealing of the substrate to activate dopants in the substrate between the forming of the dielectric layer and the forming of the interconnect structure.

17. A semiconductor structure comprising:

a substrate; and a trench capacitor overlying the substrate, wherein the trench capacitor comprises a substrate electrode, a plurality of trench electrodes, and a plurality of capacitor dielectric layers, wherein the substrate electrode is defined by a doped region of the substrate, wherein the trench electrodes and the capacitor dielectric layers are alternatingly stacked over the substrate electrode and define a plurality of trench segments that protrude into the substrate and that are arranged in a trench array, wherein the trench electrodes and the capacitor dielectric layers are recessed into the substrate at the trench segments, wherein the capacitor dielectric layers comprise a high κ dielectric material, wherein the trench array comprises a plurality of subarrays, wherein trench segments in each of the subarrays are laterally elongated crosswise to a direction along which trench segments in adjacent subarrays are laterally elongated, such that the trench array has a rotational symmetry about a center of the trench array.

18. The semiconductor structure according to claim 17, wherein the high κ dielectric material has a dielectric constant κ greater than that of silicon nitride.

19. The semiconductor structure according to claim 17, wherein the trench electrodes increase in width from a topmost one of the trench electrodes to a bottommost one of the trench electrodes, and wherein the substrate electrode has a greater width than the bottommost one of the trench electrodes.

20. The semiconductor structure according to claim 17, wherein the capacitor dielectric layers each comprise a silicon oxide layer and a high κ dielectric layer overlying the silicon oxide layer, and wherein the high κ dielectric layer comprises the high κ dielectric material.

* * * * *